United States Patent
Roohparvar et al.

(10) Patent No.: US 8,004,887 B2
(45) Date of Patent: Aug. 23, 2011

(54) CONFIGURABLE DIGITAL AND ANALOG INPUT/OUTPUT INTERFACE IN A MEMORY DEVICE

(75) Inventors: Frankie F. Roohparvar, Monte Sereno, CA (US); Vishal Sarin, Cupertino, CA (US); Jung-Sheng Hoei, Newark, CA (US)

(73) Assignee: Micron Technology, Inc., Boise, ID (US)

( * ) Notice: Subject to any disclaimer, the term of this patent is extended or adjusted under 35 U.S.C. 154(b) by 466 days.

(21) Appl. No.: 12/108,105

(22) Filed: Nov. 7, 2008

(65) Prior Publication Data
US 2010/0122103 A1    May 13, 2010

(51) Int. Cl.
*G11C 11/34* (2006.01)

(52) U.S. Cl. ......... 365/185.03; 365/189.05; 365/189.17; 365/198

(58) Field of Classification Search ............. 365/185.03, 365/185.17, 189.02, 189.05, 198, 189.17
See application file for complete search history.

(56) References Cited

U.S. PATENT DOCUMENTS

| | | | |
|---|---|---|---|
| 5,801,980 A * | 9/1998 | Wong et al. | 365/45 |
| 6,208,542 B1 * | 3/2001 | Wang et al. | 365/45 |
| 6,865,186 B1 | 3/2005 | Jackson et al. | |
| 6,897,688 B2 * | 5/2005 | Lee et al. | 327/112 |
| 6,981,090 B1 * | 12/2005 | Kutz et al. | 710/317 |
| 7,068,319 B2 * | 6/2006 | Barna et al. | 348/372 |
| 7,315,267 B2 * | 1/2008 | Chung et al. | 341/110 |
| 7,768,832 B2 * | 8/2010 | Roohparvar et al. | 365/185.17 |
| 7,898,885 B2 * | 3/2011 | Sarin et al. | 365/207 |
| 2003/0107397 A1 * | 6/2003 | Piasecki et al. | 326/37 |
| 2003/0197783 A1 * | 10/2003 | Woody et al. | 348/192 |
| 2004/0141392 A1 * | 7/2004 | Lee et al. | 365/200 |

* cited by examiner

*Primary Examiner* — Alexander Sofocleous
(74) *Attorney, Agent, or Firm* — Leffert Jay & Polglaze, P.A.

(57) ABSTRACT

Methods and memory devices are disclosed, for example a memory device that has both an analog path and a digital path that both share the same input/output pad. One of the two paths on each pad is selected in response to command signals that indicate the nature of the signal being either transmitted to the device or read from the device. Each digital path includes a latch for latching digital input data. Each analog path includes a sample/hold circuit for storing either analog data being read from or analog data being written to the memory device.

21 Claims, 9 Drawing Sheets

US 8,004,887 B2

CONFIGURABLE DIGITAL AND ANALOG INPUT/OUTPUT INTERFACE IN A MEMORY DEVICE

TECHNICAL FIELD

The present disclosure relates generally to semiconductor memory and, in one particular embodiment, the present disclosure relates to solid state non-volatile memory devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, cellular telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons that will become apparent to those skilled in the art upon reading and understanding the present specification, there is a need in the art for alternative bulk storage options.

DETAILED DESCRIPTION

Figure 1:
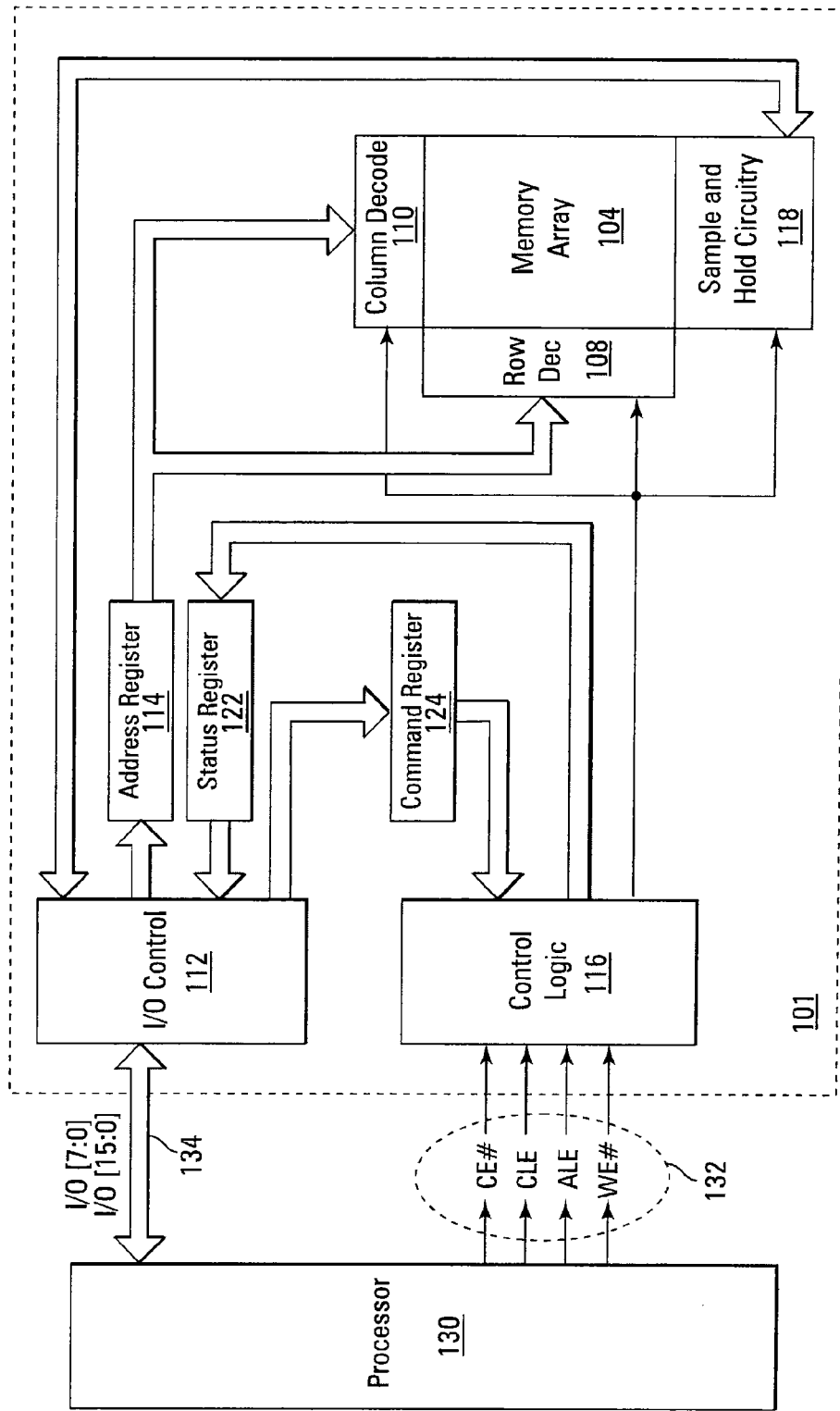
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage (Vt) ranges of 200 mV for each range, with each range corresponding to a distinct data state, thereby representing four data values or bit patterns. Typically, a dead space or margin of 0.2V to 0.4V is between each range to keep the Vt distributions from overlapping. If the Vt of the cell is within the first range, the cell may be deemed to store a logical 11 state and is typically considered the erased state of the cell. If the Vt is within the second range, the cell may be deemed to store a logical 10 state. If the Vt is within the third range, the cell may be deemed to store a logical 00 state. And if the Vt is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the Vt of the target memory cell is moved from the Vt range corresponding to the 11 logic state to the Vt range corresponding to the 10 logic state. Following programming of the LSBs, the most-significant bit (MSB) of each cell is programmed in a similar manner, shifting the Vt where necessary. When reading an MLC of a traditional memory device, one or more read operations determine generally into which of the ranges the Vt of the cell voltage falls. For example, a first read operation may determine whether the Vt of the target memory cell is indicative of the MSB being a 1 or a 0 while a second read operation may determine whether the Vt of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as Vt ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their Vt levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
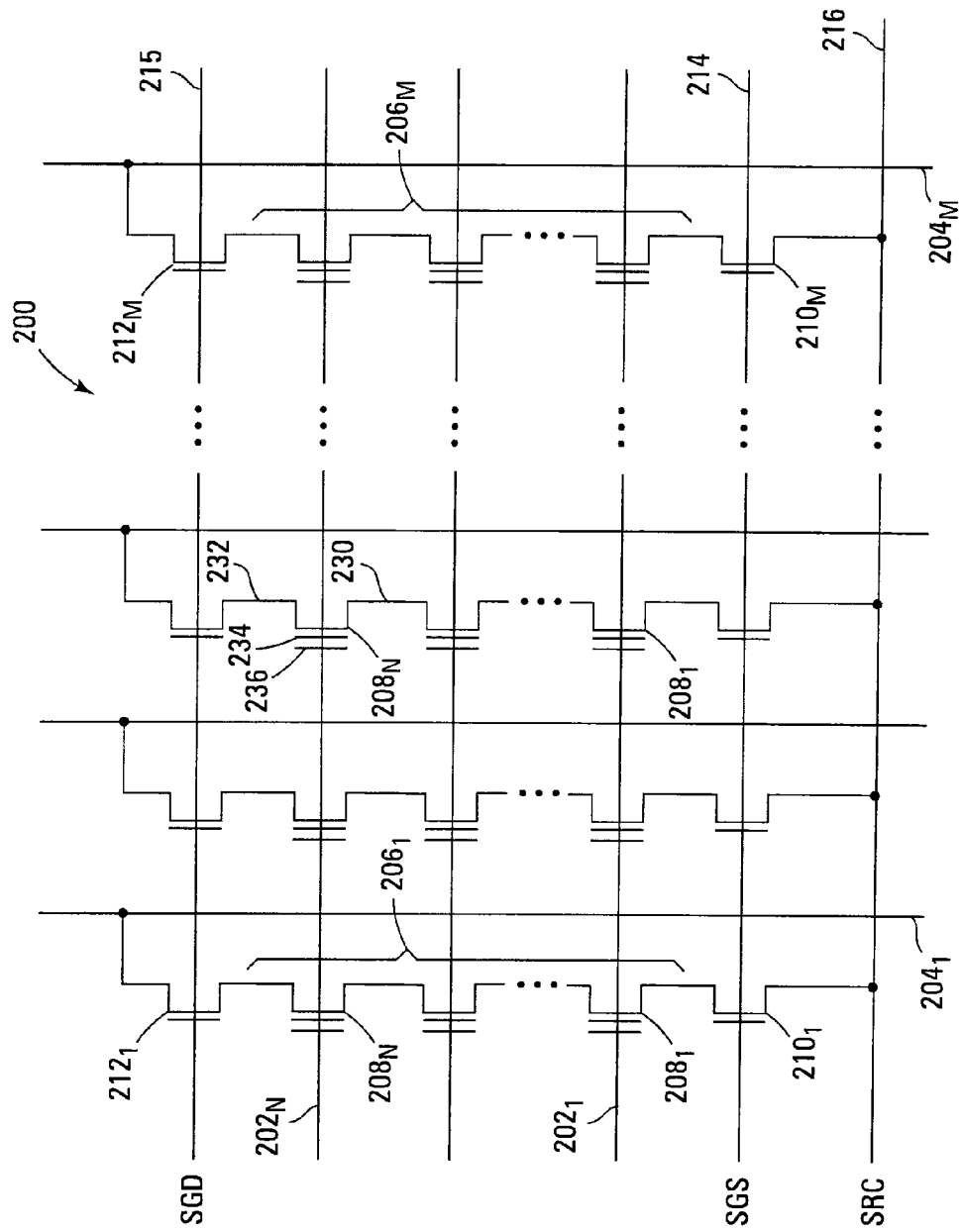
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines 202$_1$ to 202N and intersecting bit lines 204$_1$ to 204M. For ease of addressing in the digital environment, the number of word lines 202 and the number of bit lines 204 are generally each some power of two.

Memory array 200 includes NAND strings 206$_1$ to 206M. Each NAND string includes transistors 208$_1$ to 208N, each located at an intersection of a word line 202 and a bit line 204. The transistors 208, depicted as floating-gate transistors in FIG. 2, represent non volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate 210$_1$ is connected to the source of floating-gate transistor 208$_1$ of the corresponding NAND string 206$_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate 212$_1$ is connected to the local bit line 204$_1$ for the corresponding NAND string 206$_1$ at a drain contact. The source of each drain select gate 212 is connected to the drain of the last floating-gate transistor 208 of the corresponding NAND string 206. For example, the source of drain select gate 212$_1$ is connected to the drain of floating-gate transistor 208N of the corresponding NAND string 206$_1$. If multiple drain select gates 212 are utilized for a given NAND string 206, they would be coupled in series between the corresponding bit line 204 and the last floating-gate transistor 208N of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
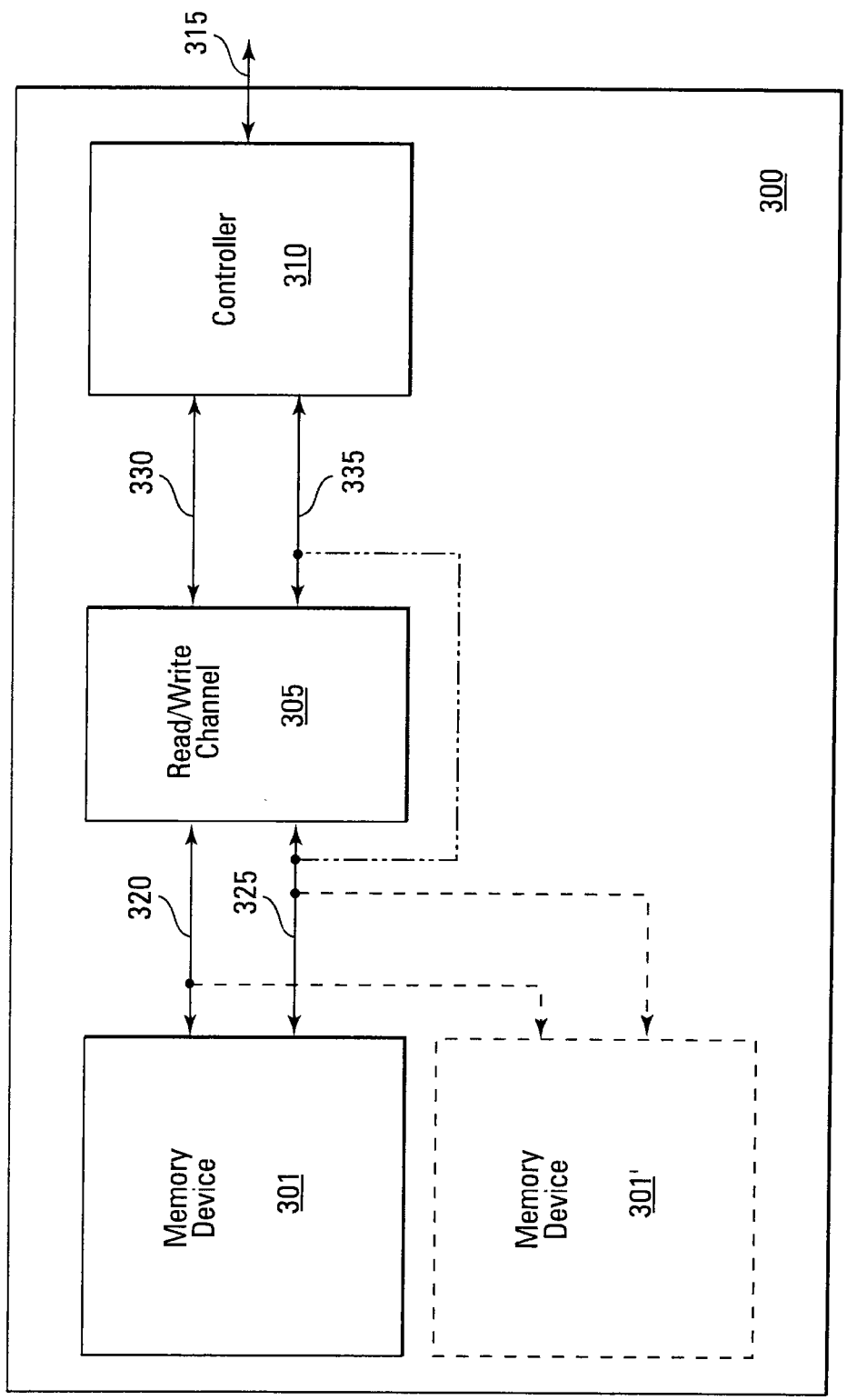
FIG. 3 is a block schematic of a solid state bulk storage system in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
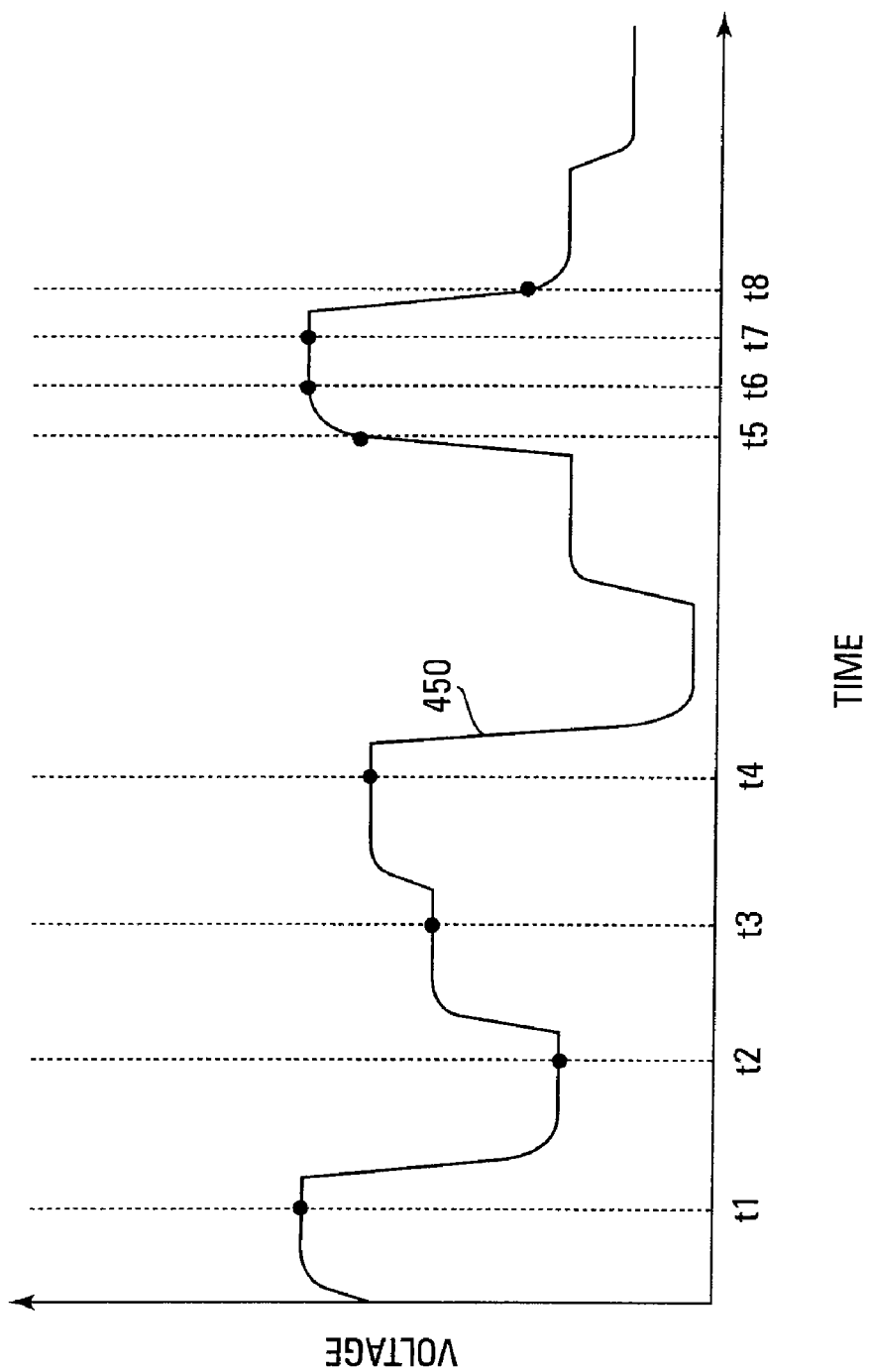
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
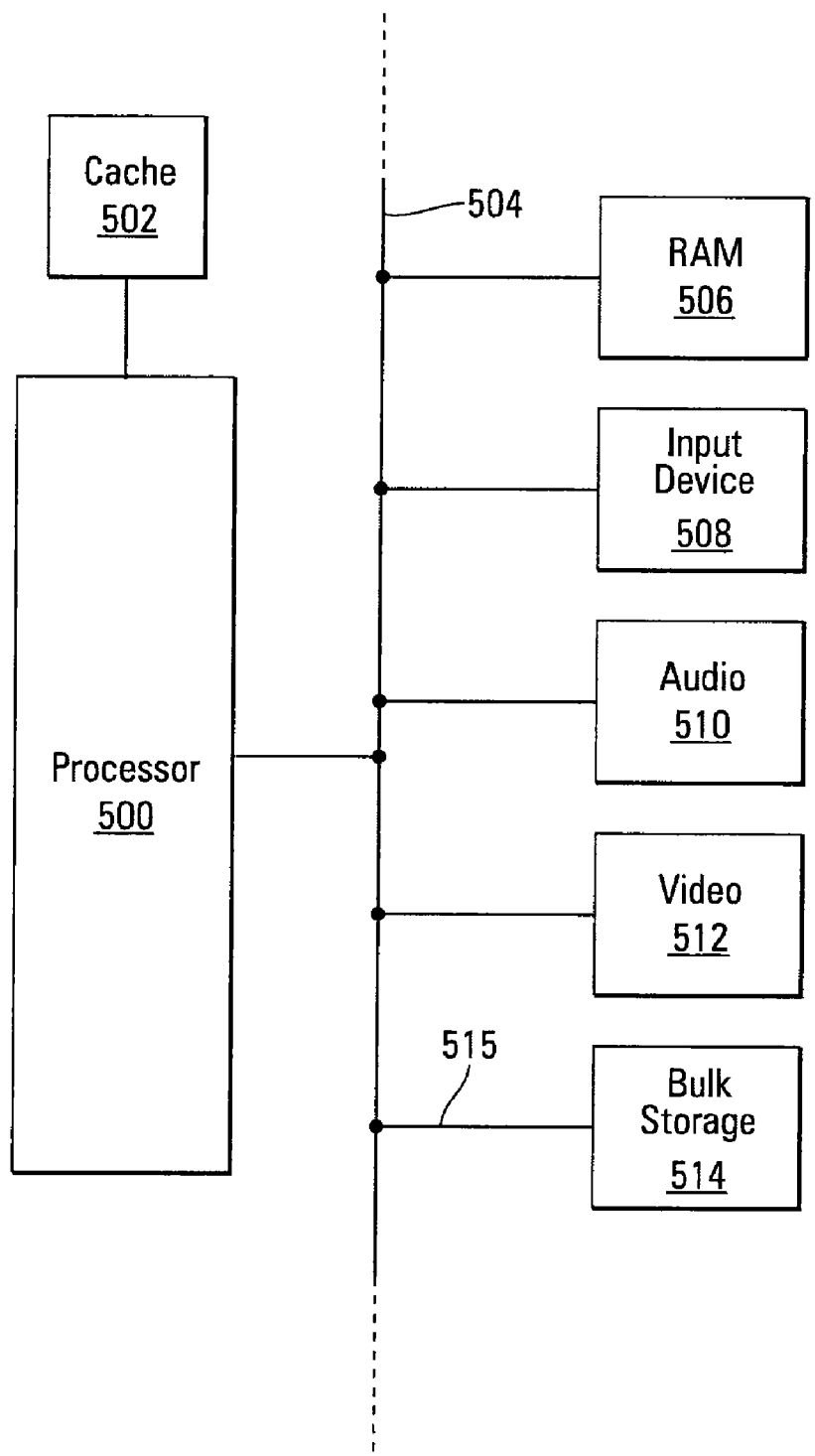
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

As additional functions are added to integrated circuits, more I/O pins are typically added to access those functions. This goes against the trend to make electronic assemblies smaller and lighter. The analog/digital I/O interface embodiments provide both analog and digital access to a memory device without increasing the pin count of the integrated circuit.

Figure 6:
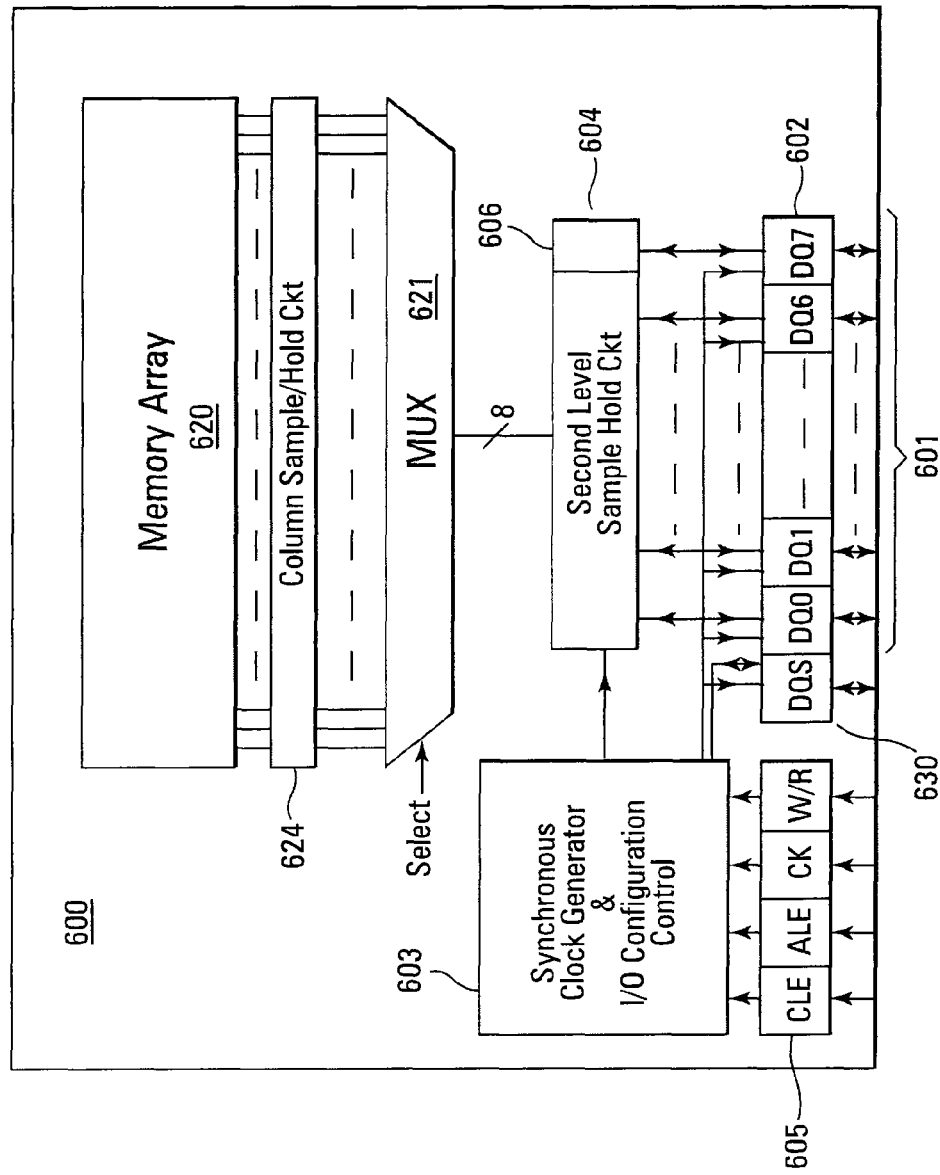
FIG. 6 is a block diagram of one embodiment of a memory device having an I/O interface with both analog and digital paths.

FIG. 6 illustrates a block diagram of a memory device comprising a separate control circuit that uses I/O pads having both a digital path and an analog path. As described previously, the clock synchronization & I/O configuration control circuit 603 is separate from the memory array 620 in such a memory device. The function of this block is to operate column multiplexing, second level sample/hold circuit, and output I/O synchronously. It also controls the I/O configurations; operates as either input or output, digital or analog.

The memory device 600 is comprised of an array of memory cells 620 such as the array illustrated in FIG. 2 and described previously. While the array is described and shown as having series strings of memory cells with a NAND structure, the present embodiments are not limited to any one memory architecture.

Column sample and hold circuitry 624 (subsequently referred to as sample/hold) is coupled to the memory array 620. The sample/hold circuitry 624 latches data, either incoming or outgoing, in the form of voltage levels. For example, the sample/hold circuitry 624 could contain capacitors or other analog storage devices for sampling either an incoming voltage signal representing data to be written to a memory cell or an outgoing voltage signal indicative of the threshold voltage sensed from a memory cell. The sample/hold circuitry 624 may further provide for amplification and/or buffering of the sampled voltage to provide a stronger data signal to an external device.

A multiplexer (MUX) 621 interfaces the column sample/hold circuitry 624 to a second level sample/hold and latch circuitry 604. The multiplexer 621 is responsible for translating the thousands of column of the memory array 620 down to the 8 bit wide second level sample/hold and latch circuitry 604. The multiplexer 621 can be controlled by the control circuit 603 or some other circuit that generates the select signals for the multiplexer 621. The width of the different buses that the multiplexer translates between is for purposes of illustration only as the present embodiments are not limited to any certain widths.

Figure 7:
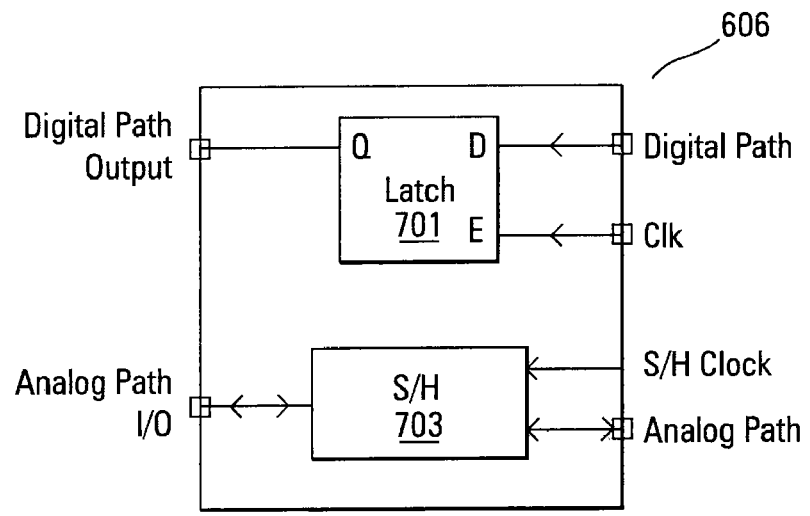
FIG. 7 is a block diagram of one embodiment of a sample and hold and latch circuit in accordance with the memory device of FIG. 6.

The second level sample/hold and latch circuitry 604 is coupled between the multiplexer 621 and the DQx pads 601 (i.e., DQ0-DQ7). The sample/hold and latch circuitry 604 is comprised of a number of sample/hold and latch circuits 606, one for each DQx pad 601. The embodiment illustrated in FIG. 6 shows an I/O width of 8 bits (i.e., 8 DQx pads and 8 sample/hold and latch circuits). Alternate embodiments can use other I/O widths. One embodiment of each second level sample/hold and latch circuit 606 is illustrated in FIG. 7 and described subsequently.

The second level sample/hold and latch circuitry 604, in one embodiment, is comprised of the same elements as the sample/hold circuitry 624 between the multiplexer 621 and the memory array 620. There may be some differences between the second level sample/hold and latch circuitry 604 and the column sample/hold circuitry 624 such as the column sample/hold circuitry 624 having higher gain than the second level sample/hold and latch circuitry 604. For example, the column sample/hold circuitry 624 could have a gain of 4 while the second level sample/hold and latch circuitry 604 might have a gain of unity.

The second level sample/hold function is used for the analog signal path when receiving and transmitting analog I/O data signals. Such signals can include voltage levels indicative of the threshold voltages read from or to be stored in the memory cells of the array 620.

Figure 8:
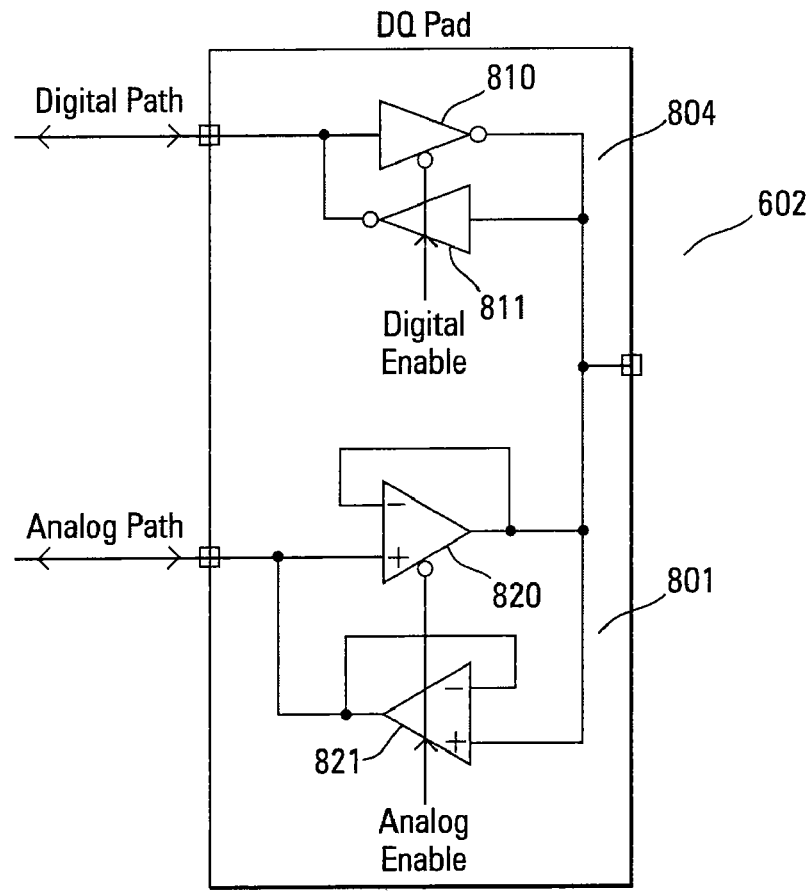
FIG. 8 is a block diagram of one embodiment of the analog/digital I/O interface in accordance with the memory device of FIG. 6.

The DQ0-DQ7 pads 601 interface the memory device 600 to external circuits, such as system controller circuits. These pads 601 are configurable for interfacing either analog signals (e.g., threshold voltages to be stored) or digital signals (e.g., address signals) to the memory device 600. One example of a DQx pad 602 is illustrated in FIG. 8 and discussed subsequently. FIG. 8 shows the DQ7 pad 602. However, each of the DQ0-DQ7 pads are substantially the same.

In one embodiment, the memory device 600 is a synchronous memory device that is synchronized to a clock signal. A dedicated, bi-directional clock channel DQS 630 provides an interface between external control circuits (e.g., a processor) and the memory device 600. The DQS block 630, in one embodiment, is the same as the DQx pad 602 except for the unity gain amplifier used in the DQx pad 602. The synchronous function of the memory device 600 can provide higher data transfer rates with better accuracy for analog data transfer than a non-synchronous memory device. The clock can be transmitted/received along with the data signals from the external circuits.

The second level sample/hold and latch circuitry 604, DQx pads 601, control bus 605, and DQS 630 dedicated bi-directional clock interface are coupled to the control circuit 603 for processing and generation of memory device control signals. In one embodiment, the control circuit 603 provides synchronous clock generation and I/O configuration control.

The control circuit 603 receives control signals from external control circuits over the control bus 605. This bus is comprised of a CLE input, an ALE input, a CK (clock) input, and a write/read input. The CLE input is the command latch enable input that instructs the control circuit 603 when the input command signal is valid. The ALE input is the address latch enable input that instructs the control circuit 603 when the input address is valid. The CK input is the clock signal for operating the control circuit 603. The CK input is a separate clock from the bi-directional synchronous clock that is input/output with the data. The W/R input informs the control circuit 603 when data is to be written to or read from the memory array.

FIG. 7 illustrates a block diagram of a sample/hold and latch circuit 606 in accordance with the memory device of FIG. 6. The circuit is comprised of a latch 701 for the digital path and a sample/hold circuit 703 for the analog path. The latch block 701 includes an input for the digital signal and a clock input that latches the digital signal into the latch 701. After the digital data has been latched into the latch 701 by the clock signal, it is available at the latch output (Q).

Figure 9:
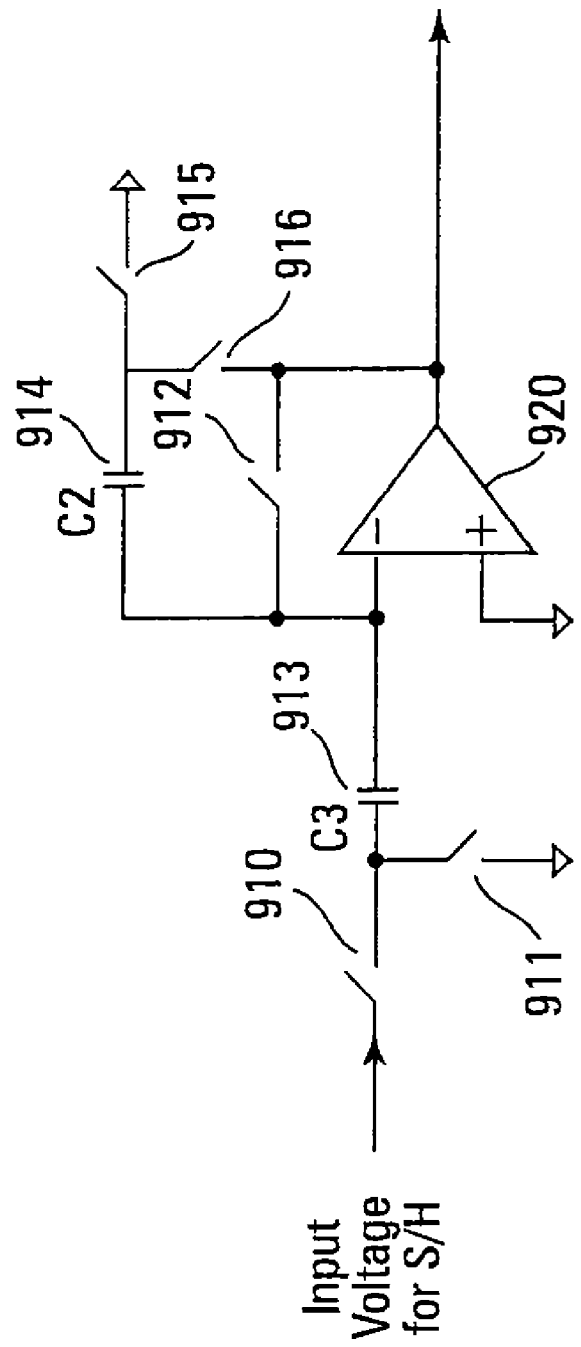
FIG. 9 is a schematic diagram of one embodiment of a column sample/hold circuit in accordance with the embodiment of FIG. 7.

The sample/hold circuit 703 has an input/output for the analog signals and an input sample/hold clock to which the analog data is synchronized. The sample/hold clock determines when the analog data is valid (e.g., leading edge or falling edge of the clock). In one embodiment, the sample/hold circuit 703 is comprised of one or more capacitors for storing the analog signal as well as timing circuits that store the analog signals as determined by the sample/hold clock. One embodiment of a sample/hold circuit is illustrated in FIG. 9 and discussed subsequently.

FIG. 8 illustrates one embodiment of a DQ pad 602 in accordance with the memory device of FIG. 6. The DQ pad is comprised of an analog path 801 and a digital path 804. Each path 801, 804 has an enable signal that is controlled by the control circuit 603 of FIG. 6. The analog and digital enable signals provide the ability to configure the DQ pad 602 to accept either digital or analog signals, thus reducing the required pin count of the memory integrated circuit.

The digital path 804 is comprised of a pair of inverting buffers 810, 811. The digital enable signal puts the buffers 810, 811 into a low impedance state when the digital path is being used. The digital enable signal puts the buffers 810, 811 into a high impedance state when the analog path is used, thus disabling the digital path.

The analog path 801 is comprised of a pair of operational amplifiers 820, 821 wired in a negative feedback mode. The operational amplifiers 820, 821 are in a low impedance state, in response to the analog enable signal, when the analog path is used. The analog enable signal puts the operational amplifiers 820, 821 into a high impedance state when the digital path 804 is used, thus disabling the analog path.

FIG. 9 shows a schematic of one embodiment of a sample/hold circuit 624 that can be used for the second level sample/hold circuit 703 in FIG. 7. During the sampling phase, switches 910, 912, and 915 are closed and the input signal is sampled on to capacitor C3 913. During the holding phase, switches 911, 916 are closed and the charge stored on capacitor C3 913 is now transferred to capacitor C2 914. The output voltage is equal to the input sample voltage with a gain factor of C3/C2.

Figure 10:
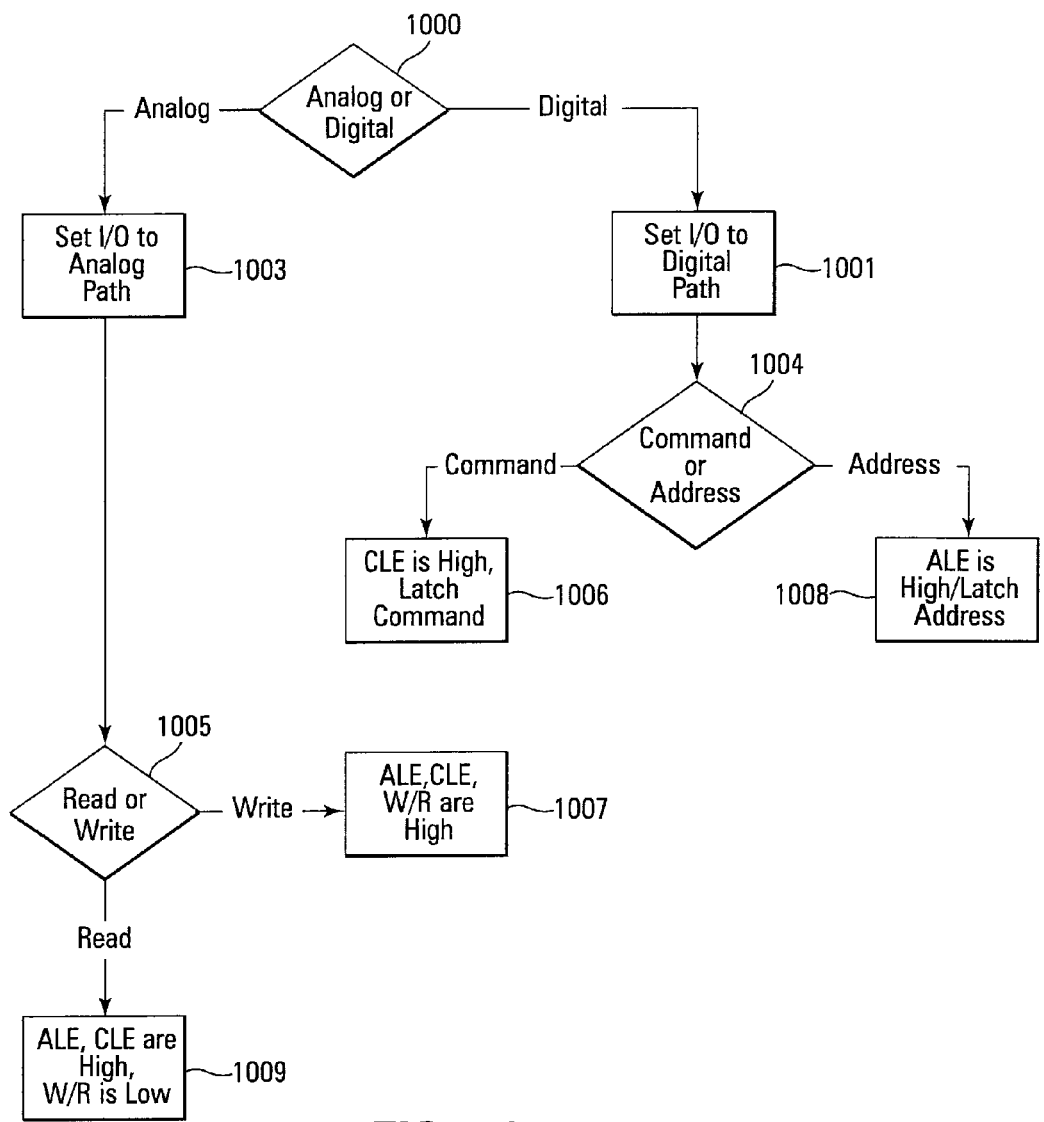
FIG. 10 is a flowchart of one embodiment of a method for switching between analog and digital I/O paths in a memory device.

One embodiment of a method for switching between analog and digital data paths 1000 is illustrated in FIG. 10. When the memory device 600 of FIG. 6 is going to receive analog data from an external circuit (e.g., processor) as part of a write operation, the ALE and CLE signals are a logical low to instruct the memory control circuit to configure the DQ pads as analog. The W/R signal is asserted high to instruct the memory control circuit to configure the DQ pads as analog input buffers. The input analog data is then sampled by the second level sample/hold circuits. In one embodiment, the sampling occurs on the rising edge of the data strobe clock (DQS) that is received with the analog data.

When the memory device is going to transmit analog data to an external circuit as part of a read operation, the ALE and CLE control signals are asserted low and the W/R signal is low 1003, 1005, 1009. This instructs the memory control circuit to configure the DQ pads as analog output buffers. Analog data will then be sampled by sample/hold circuits (not shown) on the external circuit side. The output analog data sampling is accomplished on the rising edge of the DQS signal.

When the memory device is going to receive an address (i.e., digital data), the ALE and CLE signals are asserted high 1002, 1004, 1008. The DQ pads are configured as digital input buffers by a high W/R signal. The addresses are latched into the latch circuit of the sample/hold circuit by the rising edge of the CK clock signal from the external circuit.

When the memory device is going to receive a command (i.e., digital data), the CLE signal is asserted high 1002, 1004, 1006. The DQ pads are configured as digital input buffers by a high W/R signal. The command is latched into the latch circuit of the sample/hold circuit by the rising edge of the CK clock signal from the external circuit. If the memory device is going to output digital data, the W/R signal is at a logical low to configure the I/O buffers as outputs.

CONCLUSION

The embodiments of the present disclosure provide for a reduced pin count in a memory device by switching between analog and digital paths on an I/O interface. When a digital command or address is received, the interface is switched to the digital path. When an analog signal (e.g., representation of a digital bit pattern) is input, the analog path is enabled.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device comprising:
    a memory controller for controlling operation of the memory device;
    a configurable input/output interface coupled to the memory controller, the input/output interface having a plurality of input/output pads, a digital path for digital signals, and an analog path for analog signals, wherein each path is selectable by the memory controller, and wherein each input/output pad shares both the digital path and the analog path;
    wherein each analog path comprises a sample/hold circuit and a pair of operational amplifiers configured to allow operation of the analog path; and
    wherein each digital path comprises a latch and a pair of buffers wherein the latch is configured to latch a digital signal input from the input/output interface to which it is coupled.

2. The memory device of claim 1 and further including a bi-directional clock input/output buffer coupled to the memory control circuit for receiving and transmitting a synchronizing clock that accompanies the analog signals.

3. The memory device of claim 1 and further including a control bus coupled to the memory control circuit wherein control signals on the control bus determine whether the digital path or the analog path is selected.

4. The memory device of claim 1 wherein the configurable input/output interface is part of the DQ pads of the memory device.

5. The memory device of claim 1 wherein the memory device is a NAND non-volatile memory device.

6. The memory device of claim 1 wherein the digital signals comprise memory device commands and address signals and the analog signals comprise data to be stored in the memory device.

7. The memory device of claim 1 wherein the digital path comprises buffers having a high impedance mode and the analog path comprises operational amplifiers having a high impedance mode.

8. A non-volatile memory device comprising:
    a memory array comprising a plurality of memory cells;
    a plurality of sample/hold circuits coupled to the memory array, each sample/hold circuit comprising a digital path for latching digital data and an analog path for storing analog data;
    a plurality of input/output pads, each input/output pad having a digital path and an analog path respectively coupled to the digital path and the analog path of a different one of the plurality of sample/hold circuits;
    a memory controller coupled to the plurality of sample/hold circuits and the plurality of input/output pads, the memory control circuit configured to control selection of one of the digital path or the analog path at least partially in response to control inputs to the memory device;
    a multiplexer coupled to the plurality of sample/hold circuits; and
    a plurality of column sample/hold circuits coupled between the memory array and the multiplexer wherein the multiplexer is configured to translate between the plurality of column sample/hold circuits and the plurality of sample/hold circuits.

9. The memory device of claim 8 wherein each analog path in each of the plurality of sample/hold circuits is configured to store a voltage that is indicative of a threshold voltage to be stored in a selected memory cell of the plurality of memory cells.

10. The memory device of claim 9 wherein each digital path in each of the plurality of sample/hold circuits is configured to latch a digital input signal that is indicative of one or a memory device command or a memory address of the selected memory cell.

11. The memory device of claim 8 wherein the control inputs to the memory device comprise an address latch enable signal, a command latch enable signal, and a write/read signal.

12. A solid state drive, comprising:
   an array of non-volatile memory cells, each memory cell configured to store a threshold voltage;
   a plurality of input/output pads for interfacing external circuits with the solid state drive;
   a plurality of analog data paths, each path coupled between a different input/output pads and the array;
   a plurality of digital data paths, each path coupled between a different input/output pads and the array wherein each input/output pad shares both a digital data path and an analog data path;
   control circuitry for controlling operation of the array of non-volatile memory cells wherein the control circuitry is configured to select one of the analog data path or the digital data path of each input/output pad in response to a control signal input to the control circuitry;
   wherein each analog path of the plurality of analog paths comprises a sample/hold circuit and a pair of operational amplifiers configured to allow operation of the analog path; and
   wherein each digital path of the plurality of digital paths comprises a latch and a pair of buffers wherein the latch is configured to latch a digital signal input from the input/output pad to which it is coupled.

13. The solid state memory device of claim 12 wherein the control circuitry further comprises circuitry to read analog data signals from the memory cells and to generate digital signals indicative of the read analog data signals.

14. The solid state memory device of claim 12 wherein the control circuitry further comprises circuitry to receive a digital data signal indicative of a memory state and to convert the digital data signal to an analog data signal indicative of a threshold voltage of the memory state.

15. A non-volatile memory device comprising:
   a memory array comprising a plurality of memory cells;
   a plurality of sample/hold circuits coupled to the memory array, each sample/hold circuit comprising a digital path for latching digital data and an analog path for storing analog data;
   a plurality of input/output pads, each input/output pad having a digital path and an analog path respectively coupled to the digital path and the analog path of a different one of the plurality of sample/hold circuits; and
   a memory controller coupled to the plurality of sample/hold circuits and the plurality of input/output pads, the memory control circuit configured to control selection of one of the digital path or the analog path at least partially in response to control inputs to the memory device;
   wherein each analog data path comprises a sample/hold circuit and a pair of operational amplifiers configured to allow bidirectional operation of the analog data path; and
   wherein each digital data path comprises a latch and a pair of buffers wherein the latch is configured to latch a digital signal input from the input/output pad to which it is coupled.

16. The solid state memory device of claim 15 wherein the non-volatile memory cells are programmable to three or more levels.

17. The solid state memory device of claim 15 wherein the plurality of input/output pads include a bidirectional clock input/output pad.

18. A method for switching a received signal between an analog path and a digital path in a memory device including a plurality of input/output pads, wherein each input/output pad shares both the analog path and the digital path, the method comprising:
   determining if the signal is analog or digital;
   enabling the analog path and disabling the digital path if the signal is analog wherein the analog path comprises a sample/hold circuit and a pair of operational amplifiers to enable operation of the analog path; and
   enabling the digital path and disabling the analog path if the signal is digital wherein the digital path comprises a latch to latch the digital signal.

19. The method of claim 18 wherein if the signal is digital, further including determining if the signal is a command or an address in response to received control signals.

20. The method of claim 18 wherein if the signal is digital, latching the digital signal in a latch in the digital path.

21. The method of claim 18 wherein if the signal is analog, storing the analog signal into a sample/hold circuit in the analog path.

* * * * *